United States Patent
Suzuki et al.

(10) Patent No.: US 6,910,166 B2
(45) Date of Patent: Jun. 21, 2005

(54) METHOD OF AND APPARATUS FOR TIMING VERIFICATION OF LSI TEST DATA AND COMPUTER PRODUCT

(75) Inventors: Masahito Suzuki, Kawasaki (JP); Ryuji Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 462 days.

(21) Appl. No.: 10/253,713

(22) Filed: Sep. 25, 2002

(65) Prior Publication Data

US 2003/0093729 A1 May 15, 2003

(30) Foreign Application Priority Data

Nov. 6, 2001 (JP) ......................................... 2001-340392

(51) Int. Cl.[7] .............................................. G06F 11/00
(52) U.S. Cl. ....................................................... 714/741
(58) Field of Search ................................. 714/741, 738, 714/739, 744, 798, 811, 814, 724, 32, 33, 37; 716/1, 4, 5, 6; 703/13, 14, 19, 21, 22

(56) References Cited

U.S. PATENT DOCUMENTS 6,401,227 B1 * 6/2002 Yasue et al. ................. 714/744
6,453,437 B1 * 9/2002 Kapur et al. ................. 714/741
6,473,881 B1 * 10/2002 Lehner et al. ................. 716/2
6,832,361 B2 * 12/2004 Cohn et al. ..................... 716/6

FOREIGN PATENT DOCUMENTS

JP         8-221465        8/1996
JP         2000-293555    10/2000

* cited by examiner

Primary Examiner—Christine T. Tu
(74) Attorney, Agent, or Firm—Staas & Halsey LLP

(57) ABSTRACT

Timing verification of the LSI test data is performed as follows. In test synthesis, a script text for static timing analysis (STA) is generated together with a test circuit. The STA script text is used to perform static timing analysis. Function verification is performed between a netlist generated through the test synthesis and a timing-verified netlist based on the static timing analysis. The function-verified netlist is released to a production division, and the netlist is used to automatically generate a test pattern by an automatic test pattern generation (ATPG) tool. A netlist comprising test vectors for automatic test equipment is acquired from the generated ATPG pattern.

14 Claims, 4 Drawing Sheets

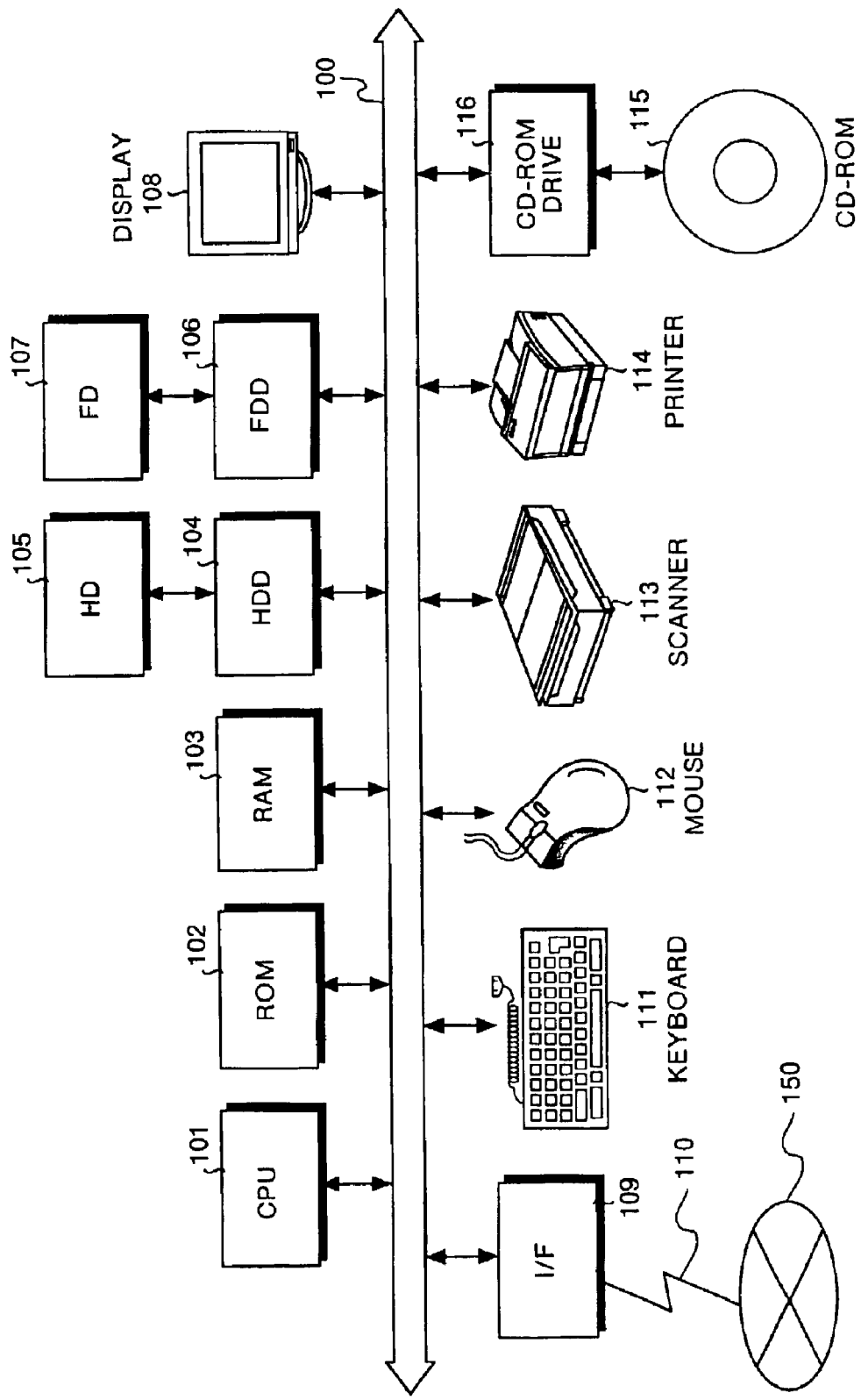

METHOD OF AND APPARATUS FOR TIMING VERIFICATION OF LSI TEST DATA AND COMPUTER PRODUCT

FIELD OF THE INVENTION

The present invention relates to verification of LSI test data when an automatic test pattern generation (ATPG) tool is utilized to generate data consisting of test patterns.

BACKGROUND OF THE INVENTION

Generally, an LSI test is performed by using automatic test equipment (ATE). Test data used in the ATE is generated by using the ATPG tool which can automatically generate a test pattern satisfying a remarkably high coverage (failure detection) in a short time. The test pattern generated by this ATPG tool (hereinafter, referred to as ATPG pattern) is used to verify system operation and timing, and is converted to a pattern to be interfaced to the ATE.

FIG. 1 is a flowchart which shows an outline of a conventional timing verification method for LSI test data. As shown in FIG. 1, conventionally, test synthesis is first performed based on a first netlist 121 (chip data 1) according to a specification based on customer requests or the like (step S121). Layout processing such as a cell arrangement and intercell wiring are performed based on a resultant second netlist 122 (chip data 2) (step S122).

The ATPG tool automatically generates an ATPG pattern based on a resultant third netlist 123 (chip data 3) (step S123). Data (test vector) 124 comprising the generated ATPG pattern is used to perform a timing verification with a gate simulation (step S124). This timing verification is started at the stage when verification of the system operation is almost completed. The verification of the system operation is omitted in FIG. 1.

When a violation is found as the result of the simulation, the first to third netlists 121, 122 and 123, and data (test vector) 124 are appropriately corrected (step S125). When the result of the gate simulation is good, the test vector is released to a production division (step S126), data (test vector) 125 comprising the test vector without violation is converted to an ATE data format (step S127). Thus, data (test vector) 126 comprising the ATE test vector is acquired. So far, the timing-verified test data is acquired. The acquired test data is used for an ATE test (step S128).

However, in recent years, a large scaling of an LSI has been advanced, and the data amount of the ATPG pattern has been remarkably increased. Therefore, there has been a problem that it takes an enormous time for the gate simulation. Further, when a timing failure is found with the simulation, the gate simulation is performed again after the failure is corrected, and therefore there has been a problem that it takes an enormous time to acquire verified test data. Further, there has been a problem that the data amount of the ATPG pattern is large and therefore a design environment such as a disk capacity to be used is pressed when the ATPG pattern is converted to the ATE pattern after the timing verification, or that it takes a very long time to handle the data.

As a measure against the problem that the gate simulation time is long, it is considered that the timing verification is performed on only a part of the ATPG patterns to reduce the verification time. However, with this, the timing verification is not performed on all the ATPG patterns, thereby, a yield in a shipment test may be greatly reduced.

When it is necessary to correct a critical portion (critical path) on the system operation as a result of the timing verification, a designer is burdened with finding the portion to be corrected from the ATPG patterns and manually performing a pattern correction.

Generally, with respect to the system operation, a static timing analysis tool (hereinafter, referred to as STA) is used to perform the timing verification for a synchronous circuit portion, and the gate simulation is performed only for an asynchronous circuit portion. Further, with respect to function verification, a formal verification tool is used to reduce the number of steps in the entire verification. As described above, in the other verification than the timing verification of the ATPG pattern, the verification time is reduced.

However, the STA is not used for the timing verification of the ATPG pattern. The reason is because, since a semiconductor designer does not know how to perform the timing verification of the test circuit automatically generated through test synthesis, a condition of the STA cannot be set. Further, the reason is because, since the result of performing the timing verification with the STA cannot be input into the ATPG tool and reflected, there is no assurance of a coincidence between the result of static timing analysis and the ATPG pattern. Further, when a test mode is erroneously set, a timing verification may be failed.

Further, as another reason why the STA is not used for the timing verification of the ATPG pattern, a high-speed simulator dedicated to a scan pattern may be considered. This high-speed simulator performs a reduction of a simulation time by omitting the timing verification with respect to a shift operation of the scan pattern. However, due to enlargement of LSI in recent years, it takes a very long time for the simulation even when this high-speed simulator is used.

SUMMARY OF THE INVENTION

It is an object of the present invention to provide a method of and apparatus for timing verification of LSI test data capable of reducing a time for generating a timing-verified ATPG pattern by using a STA, and a computer product for causing a computer to execute the method according to the present invention.

The timing verification method for LSI test data according to one aspect of this invention comprises generating a test circuit by a test circuit generation tool, extracting information required to create a timing script text for performing static timing analysis from the test circuit, and generating the timing script text based on the extracted information and default timing information. The timing verification method also comprises performing static timing analysis by using the timing script text, acquiring timing information whose timing has been verified, and generating a test pattern by an automatic test pattern generation (ATPG) tool based on the timing information whose timing has been verified.

The timing verification program for LSI test data according to another aspect of this invention causes a computer to execute steps of generating a test circuit by a test circuit generation tool, extracting information required to create a timing script text for performing static timing analysis from the test circuit, and generating the timing script text based on the extracted information and default timing information. The timing verification program also causes the computer to execute steps of performing static timing analysis by using the timing script text, acquiring timing information whose timing has been verified, and generating a test pattern by an ATPG tool based on the timing information whose timing has been verified.

The timing verification apparatus for LSI test data according to still another aspect of this invention, comprises a test circuit generation tool which generates a test circuit, and a timing script text generation unit which extracts information required to create a timing script text for performing static timing analysis from the test circuit and generates the timing script text based on the extracted information and default timing information. The timing verification apparatus also comprises a timing information acquisition unit which performs static timing analysis by using the timing script text and acquires timing information whose timing has been verified, and an automatic test pattern generation tool which generates a test pattern based on the timing information whose timing has been verified.

Other objects and features of this invention will become apparent from the following description with reference to the accompanying drawings.

BRIEF DESCRIPTION OF THE DRAWINGS

FIG. 4 is a block diagram which shows a hardware configuration of a computer provided to perform the timing verification method for LSI test data according to the present invention.

DETAILED DESCRIPTION

Figure 1:
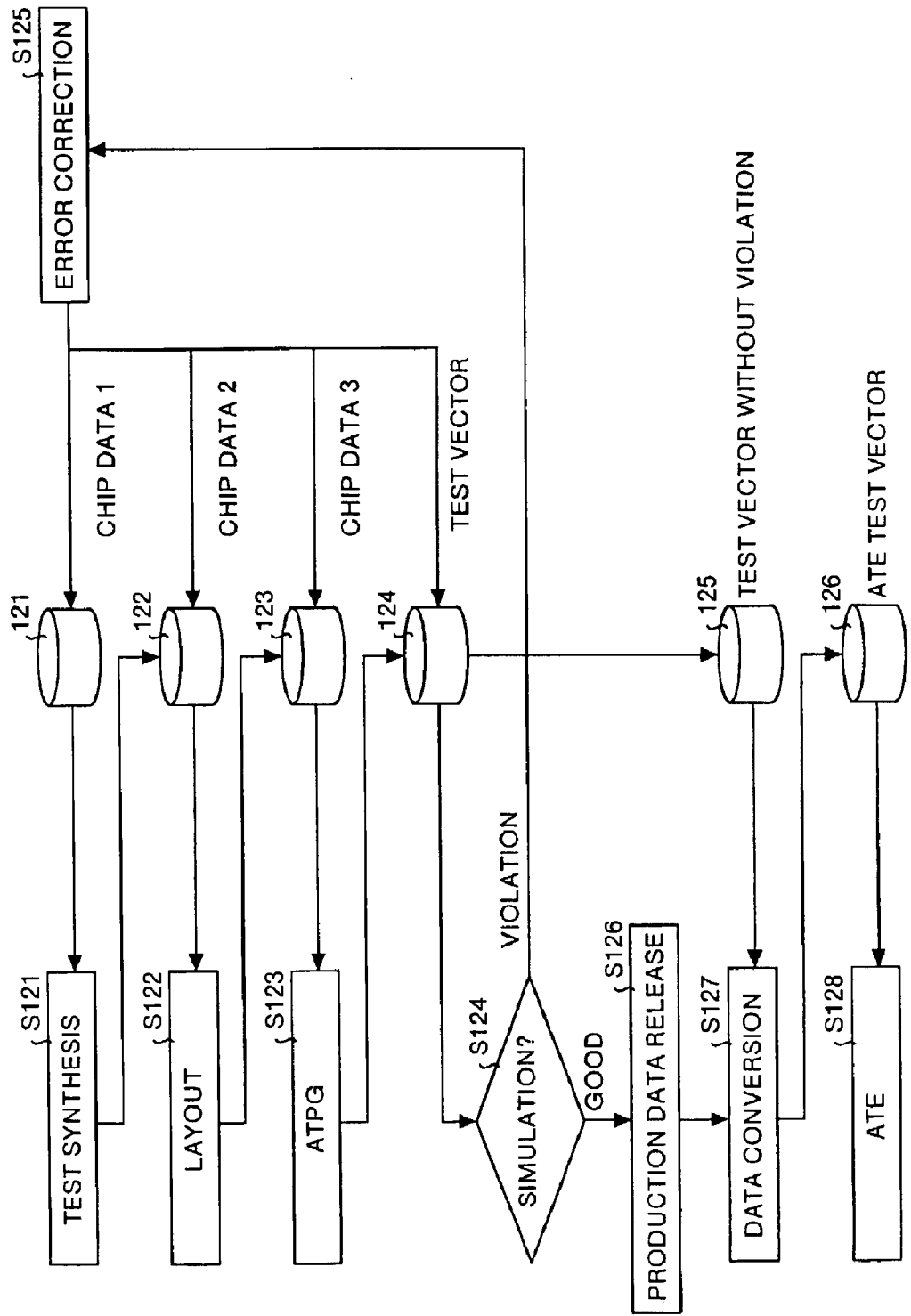
FIG. 1 is a flow chart which shows an outline of a conventional timing verification method for LSI test data.
Figure 2:
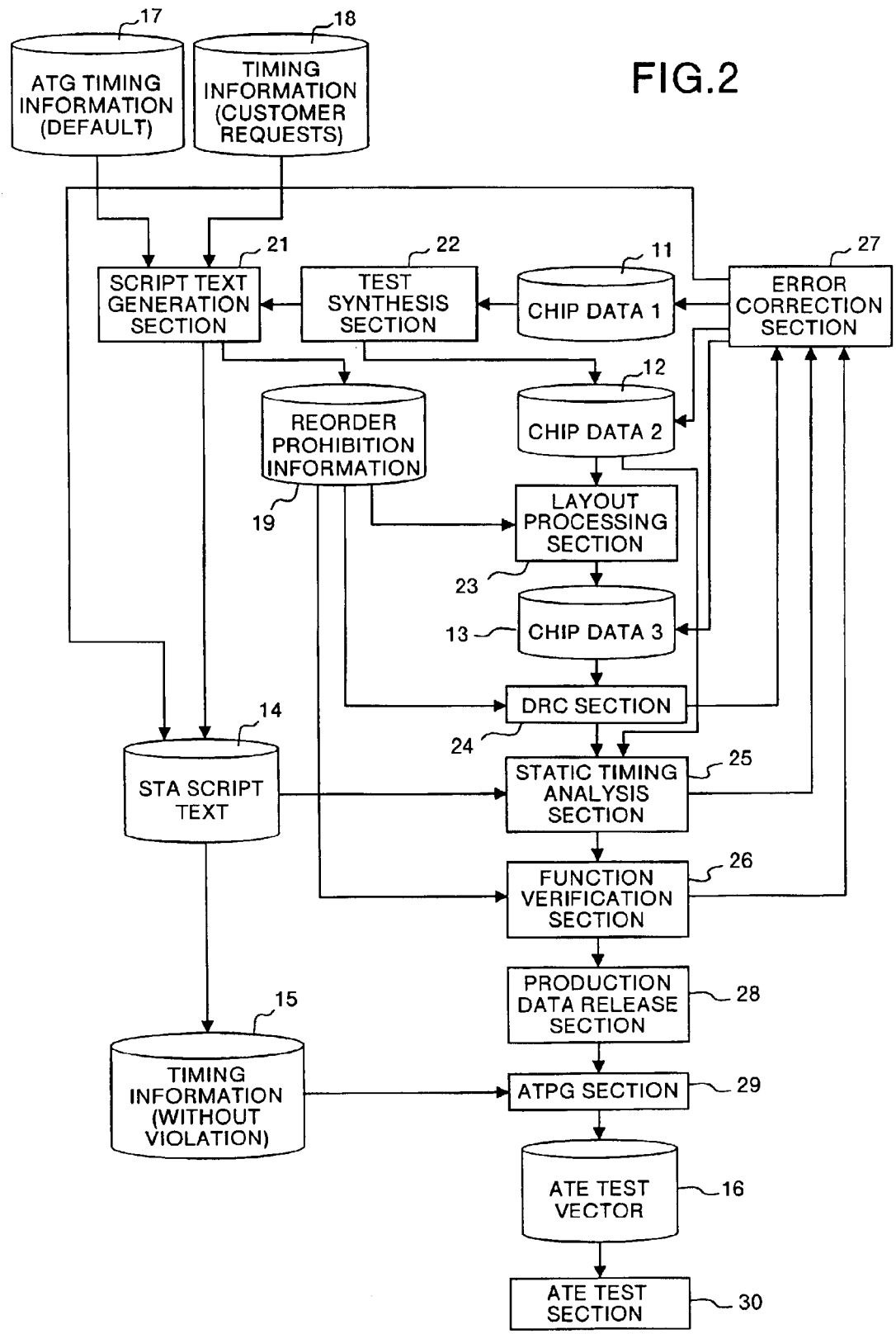
FIG. 2 is a functional block diagram which shows an example of an outline of the timing verification method for LSI test data according to the present invention.

An embodiment of this invention will be explained in detail below with reference to the drawings. FIG. 2 is a functional block diagram which shows an example of an outline of the LSI test data timing verification method according to this invention.

In FIG. 2, the LSI test data timing verification method according to this invention is realized based on respective data storage sections such as a first netlist (chip data 1) 11, a second netlist (chip data 2) 12, a third netlist (chip data 3) 13, a STA script text 14, timing information (without violation) 15, an ATE test vector 16, an automatic test data generation (ATG) timing information (default) 17, timing information (customer requests) 18, and reorder prohibition information 19. The above respective data storage sections 11 to 19 can realize the functions thereof with a rewritable recording medium such as a RAM 103, a HD 105, or a FD 107 shown in FIG. 4 explained later, respectively.

The first netlist (chip data 1) 11 is chip data according to a specification based on customer requests or the like, the second netlist (chip data 2) 12 is chip data acquired by a test synthesis section 22, and the third netlist (chip data 3) 13 is chip data acquired by a layout processing section 23. Further, the STA script text 14 is data on a timing script text for STA (hereinafter, referred to as STA script text) which is acquired by a script text generation section 21.

The timing information (without violation) 15 is timing information on the STA script text in which the STA script text 14 has been corrected by an error correction section 27 so that a violation does not occur in a static timing analysis section 25. The ATE test vector 16 is timing-verified test data. The ATG timing information 17 is information on a default ATG timing, the timing information (customer requests) 18 is information on a timing requested by a customer, and the reorder prohibition information 19 is information on prohibition against re-ordering a scan chain of a certain test circuit.

Further, constituents for realizing the timing verification method include the script text generation section 21, the test synthesis section 22, the layout processing section 23, a test design rule check (DRC) section 24, the static timing analysis section 25, a function verification section 26, the error correction section 27, a production data release section 28, an ATPG section 29, and an ATE test section 30. The above respective constituents 21 to 30 can realize the functions thereof by performing a program recorded in a recording medium such as a ROM 102, the RAM 103, the HD 105, the FD 107, a CD-ROM 115 as shown in FIG. 4 explained later by a CPU 101, respectively.

The script text generation section 21 automatically generates STA script text on the basis of circuit information extracted by the test synthesis section 22, the ATG timing information 17 of a default, and the timing information 18 requested by a customer. Further, the test synthesis section 22 extracts information necessary for creating the STA script text from the test circuit generated through test synthesis.

The layout processing section 23 performs layout processing such as a cell arrangement and an intercell wiring on the basis of the second netlist (chip data 2) 12. Further, the test design rule check (DRC) section 24 performs the test design rule check on the basis of the third netlist (chip data 3) 13. Further, the static timing analysis section 25 performs a static timing analysis.

The function verification section 26 verifies whether a function of the second netlist 12 generated by the test circuit generation tool coincides with a function of a netlist which has been finally timing-verified with the static timing analysis, that is, with a function of the netlist provided for an ATPG tool which automatically generates an ATPG pattern.

When a violation is found as a result of checking with the test design rule check (DRC) section 24, the error correction section 27 appropriately corrects the first to third netlists 11, 12 and 13. Further, when a violation is found as a result of an analysis with the static timing analysis section 25, the error correction section 27 appropriately corrects the STA script text 14. Further, when a violation is found as a result of verification with the function verification section 26, the error correction section 27 appropriately corrects the first to third netlists 11, 12 and 13 and the STA script text 14.

The production data release section 28 releases test data to a production division. The ATPG section 29 converts the ATPG pattern to an ATE data format. Further, the ATE test section 30 uses the ATE test vector 16 to perform an ATE test.

Figure 3:
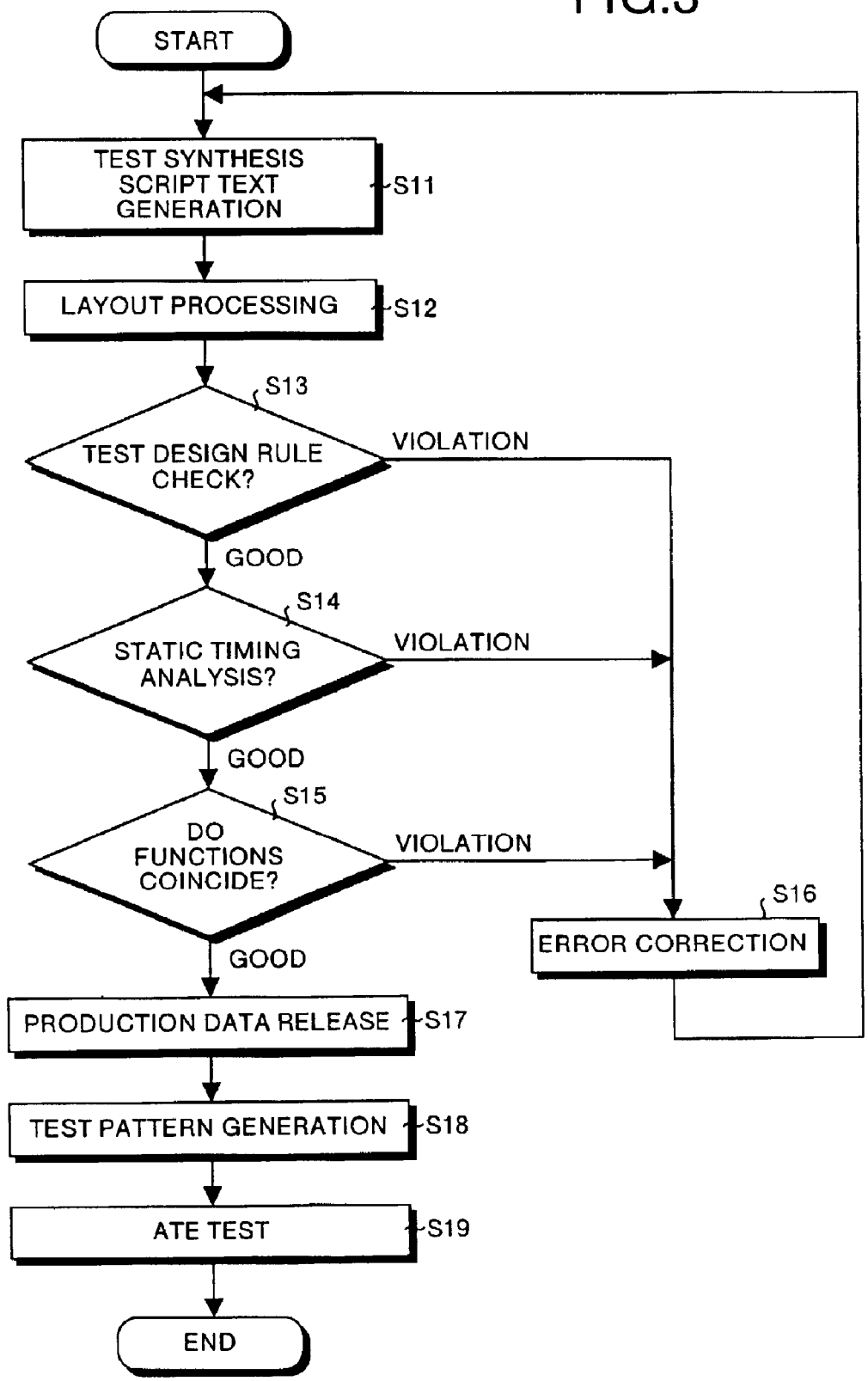
FIG. 3 is a flow chart which shows an example of a processing procedure of the timing verification method for LSI test data according to the present invention.

Next, a processing procedure of the LSI test data timing verification method will be explained. FIG. 3 is a flow chart which shows an example of the processing procedure of the LSI test data timing verification method according to the present invention. As shown in the flow chart of FIG. 3, at first, the test circuit generation tool performs the test synthesis based on the first netlist (chip data 1) 11 according to the specification based on customer requests or the like. At that time, the test circuit generation tool recognizes various test terminals, a logic value set in each test mode of the test terminals, test-clock terminal information, or the like.

Further, the test circuit generation tool extracts information necessary for creating STA script text from the test circuit generated through the test synthesis, and automatically generates the STA script text 14 based on the circuit information, the default ATG timing information 17 and the timing information 18 requested by the customer (step S11).

In the generated STA script text 14, a timing of a test-clock signal, an input timing of a scan enable signal, a scan data input/output timing, and a test cycle are set in a scan shift operating mode and a capture operating mode, respectively. Further, when generating not only a test circuit for a logic scan design but a test circuit for memory built-in self-test (BIST) or a PLL test circuit, the test circuit generation tool generates timing information which requires a verification for the respective test circuits as the STA script text 14.

Subsequently, the test circuit generation tool performs layout processing such as the cell arrangement and the intercell wiring based on the second netlist (chip data 2) 12 acquired through the test synthesis (step S12). On the basis of the resultant third netlist (chip data 3) 13, the test circuit generation tool performs test design rule checking (DRC) (step S13). When a violation is found as the result of the rule checking, the test circuit generation tool appropriately corrects the first to third netlists 11, 12, and 13 (step S16). When a violation does not occur as a result of the rule checking, the test circuit generation tool performs static timing analysis using the STA script text 14 (step S14).

When a violation is found as the result of the static timing analysis, the test circuit generation tool appropriately performs error correction on the STA script text 14 (step S16), and performs again the timing verification using the STA in the test mode and the system mode (step S14). When there is a failure of a hold time, timing engineering change order (ECO) is performed to adjust a timing of the entire circuit.

When there is a failure of a setup time, the ECO is performed to correct the failure, or the timing in the test mode is changed to perform timing convergence. When the circuit correction and the timing correction cannot be performed, information indicating that a non-correctable path is set to a non-target path for ATPG is output and to thereby interface the information to the ATPG tool. This error correction is repeatedly performed until a violation does not occur in the static timing analysis.

When the result of the static timing analysis is good, a verification is performed on whether the function of the second netlist 12 generated by the test circuit generation tool coincides with the function of a netlist which is finally timing-verified using the static timing analysis, that is, with the function of the netlist provided for the ATPG tool in order to automatically generate the ATPG pattern (step S15). This is because it is necessary to confirm whether any functions have been changed other than the change due to reorder between the second netlist 12 and the netlist provided for the ATPG tool. Further, this is because the test circuit includes a circuit which does not permit any logic to be changed such as prohibition of re-ordering a scan chain in a test circuit and it is important to perform function verification on such circuits.

In the present embodiment, these verifications are performed through, for example, formal verification or checking of the test design rule. A formal verification tool is used for a comparison between a circuit generated by the test circuit generation tool and a netlist after the final ECO, and is also used for the verification of the circuit and the netlist. Further, with a circuit in which the scan chain is used to set a test state, the verification of the circuits is performed through checking of the test design rule. The reorder prohibition information 19 is acquired in the test synthesis, and is utilized, for example, in the layout processing (step S12), or the test design rule checking (step S13) other than in the function verification.

When a violation is found as the result of the function verification, the first to third netlists 11, 12, and 13 and the STA script text 14 are appropriately corrected through the error correction until the violation does not occur (step S16), and the above processing are repeatedly performed. When the result of the function verification is good, the test data is released to the production division (step S17), and the netlist 15 comprising the timing information without violation is used to automatically generate the test pattern by the ATPG tool (step S18).

Since the generated ATPG pattern has been timing-verified based on the static timing analysis in advance, a gate simulation for this ATPG pattern is not required. Therefore, the ATPG pattern can be converted to the ATE data format without performing the timing verification. The ATPG tool is shared for a test data conversion tool which converts the ATPG pattern to the ATE data format. As described above, the netlist 16 comprising the ATE test vector can be acquired. So far, the timing-verified test data can be acquired. The acquired test data is used for the ATE test (step S19).

The aforementioned LSI test data timing verification method can be realized by allowing a computer such as a personal computer or a work station to perform a program prepared in advance. This program is recorded in a computer readable recording medium such as a hard disk, a floppy disk, a CD-ROM, an MO, or a DVD, and is read out from the recording medium by the computer to be performed. Further, this program can be distributed via the recording medium or via a network such as the Internet as a transmitting medium.

Next, a hardware configuration of a computer (i.e. timing verification apparatus for LSI test data) which performs the aforementioned LSI test data timing verification method will be explained. FIG. 4 is a block diagram which shows the hardware configuration thereof. This computer has a configuration in which, for example, the CPU 101, the ROM 102, the RAM 103, a hard disk drive (HDD) 104, a floppy disk drive (FDD) 106, a display 108, a communication interface (I/F) 109, a keyboard 111, and a mouse (including various pointing devices) 112, a scanner 113, a printer 114, and a CD-ROM drive (including a DVD drive) 116 are interconnected via a bus 100.

The CPU 101 controls the entire apparatus, and executes the program to realize functions of the respective constituents. The ROM 102 stores a boot program and the like therein. The RAM 103 is used as a work area of the CPU 101. The hard disk drive (HDD) 104 controls writing and reading of data to and from the hard disk (HD) 105 according to the control of the CPU 101. The floppy disk drive (FDD) 106 controls writing and reading of data to and from the floppy disk (FD) 107 which is a detachable recording medium, according to the control of the CPU 101.

The display 108 displays a window (browser) concerning data such as documents, images, function information as well as a cursor, icons, or a tool box. The communication interface (I/F) 109 is connected to a network 150 via a wired or wireless communication line 110, and controls an interface between the network 150 and the inside of the communication interface 109. The keyboard 111 comprises a plurality of keys to input characters, numeric, various instructions and the like. The mouse or the like 112 is used for moving the cursor and selecting an area or moving the window and changing the size thereof, selecting and moving icons, and the like.

The scanner 113 is a device which optically reads an image. The printer 114 prints out contents and the like displayed on the window. The CD-ROM drive 116 controls reading of data for the CD-ROM (including a DVD) 115 which is a detachable recording medium.

According to the aforementioned embodiment, the test pattern is automatically generated by the ATPG tool based on the netlist whose timing has been verified through the static timing analysis in advance, and therefore the acquired ATPG pattern is timing-verified. Thus, the gate simulation is not required for this ATPG pattern. Time required for the timing verification with the STA is shorter than the time required for the verification with the gate simulation. Therefore, a design development TAT can be remarkably improved. Further, according to the embodiment, the test circuit generation tool recognizes the test circuit information to generate the STA script text, and therefore a setting failure of a mode signal can be eliminated.

Further, according to the embodiment, only the production division requires the ATPG pattern, and a design division does not require the ATPG pattern. Therefore, a configuration may be provided not to generate the ATPG pattern in the design division but to generate the ATPG pattern only in the production division. By doing so, a pressure to the design environment such as a disk capacity in the design division can be modified, and time required for handling data from the design division to the production division can be reduced. Further, there is no need to store the ATPG patterns of a large amount of data in two places, i.e., the design division and the production division, unlike the conventional art. Thus, management of data or the like is simplified.

As described above, the present invention is not limited to the above embodiment and can be variously modified. For example, in place of a configuration in which the test circuit generation tool generates the STA script text, a configuration may be employed in which the STA script text is generated in the test design rule check on the basis of the information output by the test circuit generation tool, because the system logic may be required to change after the test generation is performed.

According to the present invention, since the netlist whose timing has been verified through the static timing analysis in advance is used to automatically generate the test pattern by the ATPG tool, the acquired test pattern is timing-verified. Therefore, the gate simulation is not required to be performed for this ATPG pattern. Thus, the time for timing verification can be largely reduced and the design development TAT can be remarkably improved. Further, according to the present invention, since the ATPG pattern is generated in the production division, there is no need to manage the ATPG patterns having an enormous amount of data in a plurality of divisions such as an LSI designer, a semiconductor design vendor, and a semiconductor fabrication vendor and to perform data transfer therebetween. Therefore, it is possible to slim the design environment and reduce the handling time of the data.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A timing verification method for LSI test data comprising the steps of:

generating a test circuit by a test circuit generation tool;

extracting information required to create a timing script text for performing static timing analysis from the test circuit;

generating the timing script text based on the extracted information and default timing information;

performing static timing analysis by using the timing script text to acquire timing information whose timing has been verified; and generating a test pattern by an automatic test pattern generation (ATPG) tool based on the timing information whose timing has been verified.

2. The method according to claim 1, comprising changing a timing by correcting the test circuit or correcting the timing script text when a timing failure is found as a result of performing the static timing analysis.

3. The method according to claim 1, comprising generating information for designating a portion of a ciruit where a timing cannot be corrected or changed as a non-target where a test pattern is not generated by the ATPG tool, when a timing failure is found and the timing cannot be corrected or changed due to circuit restriction as a result of performing the static timing analysis.

4. The method according to claim 3, comprising providing information on a circuit designated as the non-target where the test pattern is not generated, to the ATPG tool when a test pattern is to be generated by the ATPG tool.

5. The method according to claim 1, comprising verifying that a function of a netlist of the test circuit generated by the test circuit generation tool coincides with a function of a netlist finally provided to the ATPG tool.

6. The method according to claim 1, comprising converting a test pattern generated by the ATPG tool to a desired data format suitable for a test.

7. The method according to claim 1, comprising performing a step of generating a test pattern by the ATPG tool in an LSI production division.

8. A timing verification program for LSI test data for causing a computer to execute the steps of:

generating a test circuit by a test circuit generation tool;

extracting information required to create a timing script text for performing static timing analysis from the test circuit;

generating the timing script text based on the extracted information and default timing information;

performing static timing analysis by using the timing script text to acquire timing information whose timing has been verified; and generating a test pattern by an ATPG tool based on the timing information whose timing has been verified.

9. The program according to claim 8 for causing the computer to change a timing by correcting the test circuit or correcting the timing script text when a timing failure is found as a result of performing the static timing analysis.

10. The program according to claim 8 for causing the computer to generate information for designating a portion of a circuit where a timing cannot be corrected or changed as a non-target where a test pattern is not generated by the ATPG tool, when a timing failure is found and the timing cannot be corrected or changed due to circuit restriction as a result of performing the static timing analysis.

11. The program according to claim 10 for causing the computer to provide information for a circuit designated as the non-target where a test pattern is not generated, to the ATPG tool when the test pattern is to be generated by the ATPG tool.

12. The program according to claim 8 for causing the computer to verify that a function of a netlist of the test circuit generated by the test circuit generation tool coincides with a function of a netlist finally provided to the ATPG tool.

13. The program according to claim 8 for causing the computer to convert a test pattern generated by the ATPG tool to a desired data format suitable for a test.

14. A timing verification apparatus for LSI test data comprising:

a test circuit generation unit which generates a test circuit;

a timing script text generation unit which extracts information required to create a timing script text for performing static timing analysis from the test circuit and generates the timing script text based on the extracted information and default timing information;

a timing information acquisition unit which performs static timing analysis by using the timing script text and acquires timing information whose timing has been verified; and an automatic test pattern generation unit which generates a test pattern based on the timing information whose timing has been verified.

* * * * *